US007644489B2

(12) United States Patent
Arora et al.

(10) Patent No.: US 7,644,489 B2
(45) Date of Patent: Jan. 12, 2010

(54) THIN MEMBRANE ALIGNMENT METHOD USING PATTERNED NANOMAGNETS

(75) Inventors: William J. Arora, Lake Forest, IL (US); Fernando Castano, Cambridge, MA (US); Anthony J. Nichol, Boston, MA (US); George Barbastathis, Boston, MA (US)

(73) Assignee: Massachusetts Institute of Technology, Cambridge, MS (US)

( * ) Notice: Subject to any disclaimer, the term of this patent is extended or adjusted under 35 U.S.C. 154(b) by 496 days.

(21) Appl. No.: 11/513,952

(22) Filed: Aug. 31, 2006

(65) Prior Publication Data

US 2007/0052045 A1    Mar. 8, 2007

Related U.S. Application Data

(60) Provisional application No. 60/713,082, filed on Aug. 31, 2005.

(51) Int. Cl.
*H01F 7/06* (2006.01)
(52) U.S. Cl. .......................... 29/607; 335/285; 335/306
(58) Field of Classification Search ................ 335/284, 335/285, 302–306; 29/607
See application file for complete search history.

(56) References Cited

U.S. PATENT DOCUMENTS

| | | | | | |
|---|---|---|---|---|---|
| 3,727,658 | A | * | 4/1973 | Eldridge, Jr. | 206/370 |
| 4,258,493 | A | * | 3/1981 | Kettlestrings et al. | 40/600 |
| 4,336,806 | A | * | 6/1982 | Eldridge, Jr. | 604/174 |
| 4,447,238 | A | * | 5/1984 | Eldridge, Jr. | 24/303 |
| 5,682,653 | A | * | 11/1997 | Berglof et al. | 24/303 |
| 6,614,337 | B1 | * | 9/2003 | Winnard | 335/285 |
| 7,015,780 | B2 | * | 3/2006 | Bernstein et al. | 335/302 |

OTHER PUBLICATIONS

Hastings et al., "Nanometer-level stitching in raster-scanning electron-beam lithography using spatial-phase locking" J. Vac. Sci. Technol. B 21(6) Nov./Dec. 2003, pp. 2650-2656.
Aoki et al., "Microassembly of semiconductor three-dimensional photonic crystals" 2003 Nature Publishing Group 2003, pp. 117-121.
Arora et al., "Membrane folding to achieve three-dimensional nanostructures: Nanopatterned silicon nitride folded with stressed chromium hinges" Applied Physics Letters, 88, 2006, pp. 053108-1-053108-3.
Moon et al., "Interferometric-spatial-phase imaging for six-axis mask control" J. Vac. Sci. technol. B21(6) Nov./Dec. 2003, pp. 3112-3115.
Srinivasan et al., "Microstructure to Substrate Self-Assembly Using Capillary Forces" Journal of Microelectromechanical Systems, vol. 10, No. 1, Mar. 2001, pp. 17-24.

* cited by examiner

*Primary Examiner*—Ramon M Barrera
(74) *Attorney, Agent, or Firm*—Gauthier & Connors LLP

(57) ABSTRACT

A passive nanomagnet alignment method is described to self-align a membrane to another surface. The membrane and the surface each have a plurality of nanomagnets patterned on it, wherein the nanomagnets are magnetized based on an applied external magnetic field. The membrane is brought into close proximity and coarse alignment to the surface by a positioning mechanism (e.g., an actuation force), such that the nanomagnets on the membrane attract to and self-align with the nanomagnets on said surface based on the nanomagnet magnetizations.

35 Claims, 6 Drawing Sheets

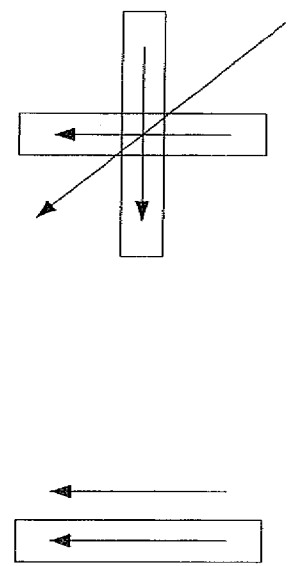
FIGURE 1b
FIGURE 1a
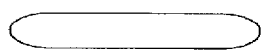
FIGURE 1e
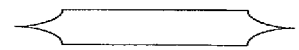
FIGURE 1c
FIGURE 1d

THIN MEMBRANE ALIGNMENT METHOD USING PATTERNED NANOMAGNETS

RELATED APPLICATION

This application claims priority to U.S. provisional application 60/713,082 filed Aug. 31, 2005, which is incorporated in its entirety herein by reference.

SPONSORSHIP INFORMATION

This invention was made with government support awarded by the Army Research Office under Grant No. DAAD19-02-D-0002. The government has certain rights in this invention.

This invention was made with government support awarded by the Defense Advanced Research Projects Agency under Contract Number HR0011-07-3-002. The government has certain rights in the invention.

BACKGROUND OF THE INVENTION

1. Field of Invention

The present invention relates generally to the field of thin membrane alignment. More specifically, the present invention is related to thin membrane alignment method using lithographically patterned magnetic material.

2. Discussion of Prior Art

The following references outline prior art alignment and alignment measurement techniques, but fail to teach or render obvious the teachings of the present invention.

The paper to Aoki et al. titled "Microassembly of semiconductor three-dimensional photonic crystals" teaches a method for manufacturing 3D photonic crystals made of multiple layers or plates, wherein neighboring plates have holes in identical positions. According to Aoki et al., the layers are automatically aligned into the correct position by inserting microspheres into the holes. Aoki's technique is referred to as a mechanical passive alignment technique because it requires no feedback.

The paper to Moon et al. titled "Inferometric-spatial-phase imaging for six-axis mask control" teaches a method for measuring alignment and gap with nanometer detectivity between two planar objects (e.g., a mask and a substrate) in close proximity. Moon's technique is referred to as an active alignment technique because it uses sensors to create a feedback loop.

The paper to Srinivasan titled "Microstructure to substrate self-assembly using capillary forces" teaches the self-assembly of micromachined silicon parts, wherein the self-assembly is accomplished using photolithographically defined part and substrate binding sites that are complimentary shapes of hydrophobic self-assembled monolayers.

Whatever the precise merits, features, and advantages of the above cited references and prior art techniques, none of them achieves or fulfills the purposes of the present invention.

SUMMARY OF THE INVENTION

The present invention provides for a passive nanomagnet alignment method to self-align a membrane to a surface, wherein the membrane and surface each having a plurality of nanomagnets patterned on it, wherein the membrane is connected to the surface by a hinge or flexural component and the method comprises the steps of: (a) applying an external magnetic field to the nanomagnets on the membrane and the surface, with the nanomagnets being magnetized based on an applied external magnetic field; and (b) applying an actuation force to fold said membrane at said hinge, bringing said membrane into close proximity to said surface, wherein the nanomagnets on the membrane self-align with nanomagnets on the surface based on nanomagnet magnetizations.

The present invention provides for a passive nanomagnet alignment method to self-align a membrane to another surface, wherein the membrane and surface each have a plurality of nanomagnets patterned on it and the method comprises the steps of: (a) applying an external magnetic field to the nanomagnets on the membrane and the surface, wherein the membrane is held by a positioning mechanism and the nanomagnets are magnetized based on the applied external magnetic field; and (b) bringing the membrane into close proximity and coarse alignment to the surface by the positioning mechanism, such that the nanomagnets on the membrane attract to and self-align with the nanomagnets on the surface based on the nanomagnet magnetizations.

The present invention also teaches a self-aligned structure comprising: a membrane having a plurality of nanomagnets patterned on it and a surface having a plurality of nanomagnets patterned on it, wherein the membrane connected to said surface by a hinge. The structure according to this embodiment is self-aligned upon application of an external magnetic field that magnetizes the nanomagnets on the membrane and the surface, and further application of an actuation force to fold said membrane at said hinge, bringing the membrane into close proximity to the surface, with the nanomagnets on the membrane self-aligned with nanomagnets on the surface based on nanomagnet magnetizations.

The present invention also teaches a self-aligned structure comprising: (a) a membrane having a plurality of nanomagnets patterned on it and a plurality of flexural component patterned on it, and (b) a surface having a plurality of nanomagnets patterned on it. The structure according to this embodiment is self-aligned upon: (a) application of an external magnetic field to the nanomagnets on the membrane and the surface, the membrane being held by a positioning mechanism and the nanomagnets being magnetized based on the applied external magnetic field; and (b) bringing the membrane into close proximity and coarse alignment to the surface by said positioning mechanism, such that the nanomagnets on the membrane attract to and self-align with the nanomagnets on said surface based on the nanomagnet magnetizations.

This process can be repeated in parallel or series for aligning multiple membranes. An example of parallel alignment is a stack of more than two membranes, each having a plurality of nanomagnets on either or both the front and backside may first be stacked and then aligned by applying an external magnetic field to magnetize the nanomagnets.

An example of series alignment is to repeat any of the above listed methods of aligning two membranes onto the existing structure.

BRIEF DESCRIPTION OF THE DRAWINGS

FIGS. 1a-e illustrate different shapes of nanomagnets that are used in conjunction with the present invention.

DESCRIPTION OF THE PREFERRED EMBODIMENTS

Figure 2A:
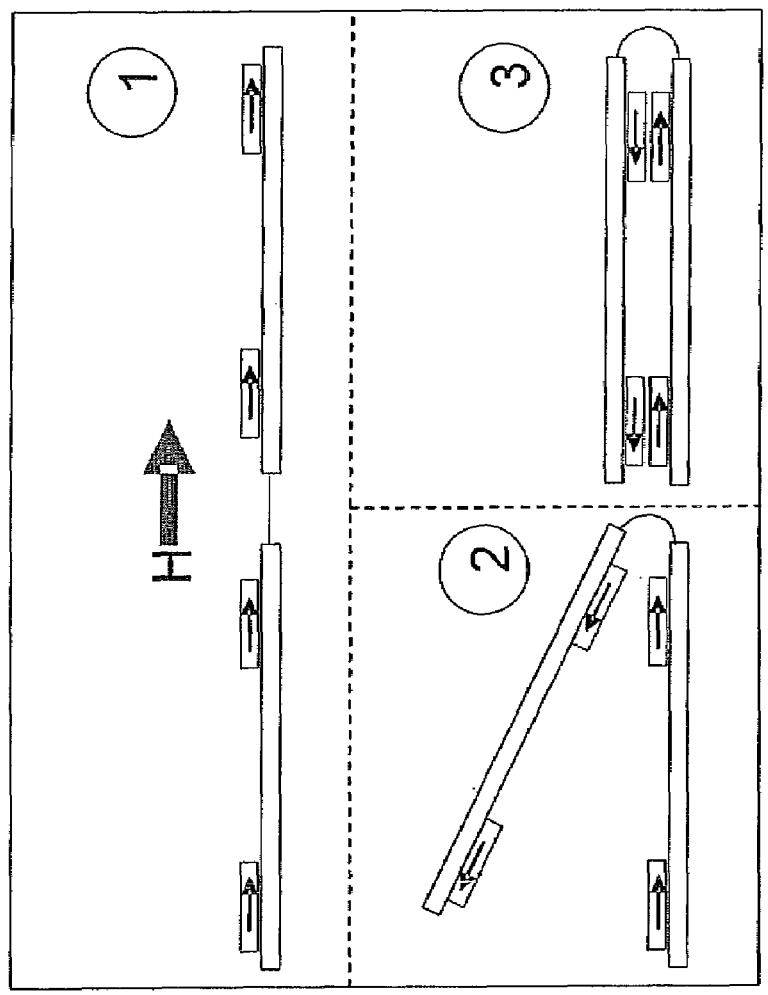
FIGS. 2a-b illustrate two embodiments of the present invention's nanomagnet alignment scheme using a folding flexural component.

While this invention is illustrated and described in a preferred embodiment, the device may be produced in many different configurations, forms and materials. There is depicted in the drawings, and will herein be described in detail, a preferred embodiment of the invention, with the understanding that the present disclosure is to be considered as an exemplification of the principles of the invention and the associated functional specifications for its construction and is not intended to limit the invention to the embodiment illustrated. Those skilled in the art will envision many other possible variations within the scope of the present invention. It should be noted that the term nanomagnets as used within the claims and the specification applies to lithographically patterned thin film magnetic material with lateral dimensions in the micron or sub-micron regime and thickness in the sub-micron. Further, the term membrane as used within the claims and the specification applies to a flat thin-film with thickness generally less than 10 microns and lateral dimensions greater than 1 micron.

Nanomagnets are patterned thin film magnetic material with lateral dimensions ranging in the sub-micron or micron regime and thickness in nanometer regime. Hard nanomagnets are those that retain a magnetic field (remanance) after an external magnetic field is applied and removed. Soft magnetic materials are those that do not retain a magnetic field but can be magnetized to high saturation when in an external magnetic field. Nanomagnets are used in a myriad of applications including storage and logic devices. The present invention describes the use of nanomagnets to finely align and latch two membranes. Oppositely magnetized nanomagnets will attract to each other when brought in vicinity of each other. The North pole of one magnet will attract to the South pole of the other magnet, and vice-versa. The attractive force depends on the nanomagnet materials and dimensions and is inversely proportional to the distance squared. If the pair of nanomagnets are misaligned, or off-set by some lateral distance, the attractive force vector between them will have a component in the direction that re-aligns them. The pair of nanomagnets will converge to a final position in which one magnet's poles are lined up with the opposite poles of the other magnet. No external forces or feedback sensors are required once the magnets are within the distance that they strongly interact. The scale of the nanomagnets roughly determines the scale of alignment capability. Nanomagnets with nanometer dimensions may be used to achieve nanometer precision alignment between two membranes. Since the attractive forces will be on the nano- or micro-scale, nanomagnets are limited to aligning thin membranes or other structures that have very little mass so that gravitational and inertial forces are much weaker than the magnetic forces. Nanomagnets can be added to the membrane in proportion to its lateral dimensions, and since the total attractive force between nanomagnets is proportional to the number of nanomagnets, the membranes can have very large lateral dimensions (ranging from microns to meters) and still be aligned by the nanomagnets. Nanomagnets are also most effective at aligning thin membranes that are able to move easily within a range of microns when acted upon by the magnetic forces. In the preferred embodiment the membranes are held by one or more flexural components. A flexural component may be a thin-film portion that is patterned to allow flexibility that is made of the same or different material as the membrane. The flexural components may either connect two membranes to each other or hold two separate membranes on rigid substrates that are brought into close proximity.

Nanomagnets may be made of iron, cobalt, nickel or any alloy consisting primarily of one or more of these metals. Most of these magnetic materials do not adhere well to silicon or silicon nitride (typical membrane materials) and therefore require an adhesion layer of either titanium or chromium. In addition, some of them oxidize (which corrodes and destroys them) and therefore require a protective film on the top surface (typically gold). A typical nanomagnet may have a 5 nm titanium adhesion layer, a 60 nm cobalt magnetic layer, and a 5 nm gold protective layer. One way to pattern this stack of material into a nanomagnet is via liftoff. The nanomagnet layer may range in thickness from 5 nm to 1000 nm.

The advantage of using cobalt is that it can be deposited at room temperature by sputtering or electron-beam evaporation and can easily be patterned by liftoff. The advantage of samarium-cobalt is a higher magnetic remanance than cobalt. However, samarium-cobalt must be sputtered at high temperature and is therefore difficult to pattern by liftoff. Neodymium-iron-boron is even stronger than samarium cobalt but even more difficult to deposit in the form of a thin film.

The magnetic properties of nanomagnets are largely dependent on shape and size. Nanomagnets create well defined stray fields when patterned as rectangles with a geometry consisting of a length to width ratio of approximately greater than 2:1 (called "elongated nanomagnets"). These elongated nanomagnets will be in magnetic saturation along the length of the nanomagnet while the external field is applied along that direction and typically have some magnetic remanance along that direction when the external magnetic field is removed. Nanomagnets with an aspect ratio of approximately less than 2:1 are less effective because they may form flux closure structures at remanance which greatly reduce the stray magnetic fields. FIG. 1a illustrates such a nanomagnet where the direction of magnetization is the same as the applied field. Interaction can be strongly enhanced by tapering the ends of the nanomagnets. FIGS. 1c-e illustrates examples of different tapers that can be applied to the bar shape. The taper may be a straight line (FIG. 1c), a concave curve (FIG. 1d), or a convex curve (FIG. 1e). The magnetic field is then concentrated around the fine tips formed by the taper. This increases the strength of the field at the poles, and alignment sensitivity. The sharpness of the tip is limited only by lithographic capability. With a scanning-electron-beam lithography system, the tips can be patterned to sizes below 30 nm. These bar shaped magnets are then magnetized through their length by applying a strong external magnetic field. If the external field is strong enough, when it is removed the nanomagnets will retain their magnetization direction.

Another useful nanomagnet geometry is a cross shape (FIG. 1b), composed of two bar shapes overlaid with one rotated 90 degrees about its center. The cross shape may be magnetized by applying an external field along a line that is 45 degrees rotated from either of the bars. The size and shape of the nanomagnets makes the magnetization prefer to be oriented along the length of each bar in the cross. Therefore, even though the applied field is not parallel to either of the bars in the cross shape, it will magnetize both along their length simultaneously.

Another useful nanomagnet geometry is a tall pillar. This nanomagnet would have its magnetization oriented through its thickness; perpendicular to the plane of the substrate. The thickness to width ratio of this nanomagnet should be approximately greater than 2:1. The top face of the pillar may be circular, rectangular, or of any geometry. Tall pillar nanomagnets have the advantage that their contact area when brought together is very small (~30×30 nm) and their misalignment should be a fraction of the length or width.

The present invention provides for precision alignment of multiple thin nanostructured membranes. One way to build 3D nanostructures is by "stacking" 2D membranes or "folding" a large membrane into a layered structure. Some 3D layered structures (e.g. photonic crystals) can have layer-to-layer alignment tolerances on the order of 50 nm or less, requiring an "active" or "passive" alignment method. The present invention is a passive alignment scheme, which means the structure works to self-align during assembly.

Figure 2B:
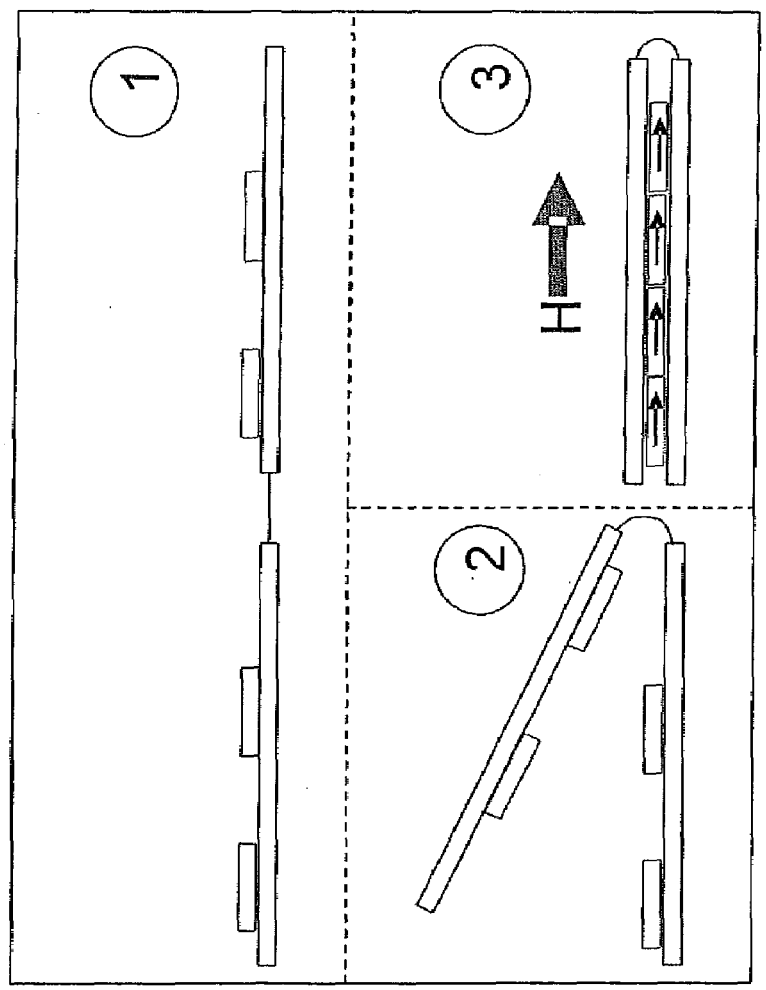

FIGS. 2a-b illustrates two passive alignment schemes using patterned nanomagnets (not to scale). The components of the figure are a thin membrane folded along a patterned hinge, arrays of nanomagnets on each of the membrane segment faces and flexural components that may be part of the hinge or be patterned into the membrane. For example the membrane may be 500 nm thick non-stoichiometric silicon nitride being folded along the hinge. The hinge may be a thinned out portion of the membrane. A typical nanomagnet array for this membrane would have multiple 50 nm-thick Co thin films patterned into 1 µm×5 µm rectangles.

In the first embodiment shown in FIG. 2a, first, an external magnetic field H is applied allowing for a high remanence. Next, the structure is folded by an actuation force and the magnets align North-South and South-North as shown. The folding along a hinge brings the membranes to coarse alignment of microns and the nanomagnets finely align the membrane to nanometers. The force between such hard magnets would be on the order of 0.1 nN. An ultrasonic vibration may be added to the system after initial assembly to help optimize alignment. Furthermore, this nanomagnet alignment strategy can be used for multiple folds and a variety of magnet shapes, sizes, materials and material processing.

According to FIG. 2a's, one embodiment of the present invention's passive nanomagnet alignment method to align two membranes comprises: (a) applying an external magnetic field to a first and second membrane, wherein the first and second membranes are connected by a flexural component, and each of the first and second membrane having a plurality of nanomagnets patterned on it, with the nanomagnets magnetized based on said applied magnetic field; and (b) applying an actuation force to fold the second membrane onto the first membrane at said flexural component such that nanomagnets on the first membrane self-align with nanomagnets of the second membrane based on opposing magnetizations.

Although the example illustrated in FIG. 2a illustrates two membranes being folded at the flexure component, such as a hinge, it should be noted that the same can be accomplished using a single membrane. According to this embodiment, the passive nanomagnet alignment method to self-align portions of a single membrane comprises: (a) applying an external magnetic field to a single membrane, wherein the single membrane comprises a first and second portion connected by a flexural component, and each of the first and second portion having a plurality of nanomagnets patterned on it, and the nanomagnets being magnetized based on the applied magnetic field; and (b) applying an actuation force to fold the single membrane at the flexural component such that nanomagnets on the first portion self-align with nanomagnets on the second portion based on opposing magnetizations.

FIG. 2b illustrates a second embodiment using soft magnets where the structure comprising two membranes having the nanomagnets are folded by an actuation forces, prior to the application of the magnetic field H. In this embodiment, the nanomagnets are patterned such that they form a single layer as shown.

According to FIG. 2b's, another embodiment of the present invention's passive nanomagnet alignment method to align two membranes comprises: (a) applying an actuation force to fold a first membrane onto a second membrane at a flexural component, wherein the first and second membranes are connected by the flexural component, and each of the first membrane and second membrane having a plurality of nanomagnets patterned on it, and the folding performed such that nanomagnets on the first membrane alternate with nanomagnets of the second membrane to form a single layer of nanomagnets; and (b) applying an external magnetic field on the folded structure such that nanomagnets are magnetized, with the single layer of nanomagnets being magnetized in the same direction and thereby self-aligning said folded structure.

Although the example illustrated in FIG. 2b illustrates two membranes being folded at the flexure component, such as a hinge, it should be noted that the same can be accomplished using a single membrane. According to this embodiment, the passive nanomagnet alignment method to self-align portions of a single membrane comprises: (a) applying an actuation force to fold a single membrane at a flexural component, wherein the single membrane comprising a first and second portion connected by the flexural component, and each of the first and second portion having a plurality of nanomagnets patterned on it, and the folding performed such that nanomagnets on the first portion alternate with nanomagnets of the second portion to form a single layer of nanomagnets; and (b) applying an external magnetic field to the folded structure such that nanomagnets are magnetized, with the single layer of nanomagnets being magnetized in the same direction and thereby self-aligning the folded structure.

The method presented is primarily for aligning thin membranes of thicknesses less than 10 microns. The distance at which the nanomagnets strongly interact for alignment is dependent on the material, size and geometry of the individual nanomagnets as well as the arrangement in which they are patterned on the membrane. Typically attractive magnetic forces substantial enough to pull the membranes together and align them laterally (~1 nano-Newton) will arise when the nanomagnets are separated by approximately 1-10 microns. For example, 60 nm thick×1 micron wide×10 micron long Samarium-Cobalt magnets magnetized along their length would substantially attract with magnets on another membrane separated by 10 microns. Smaller magnets would attract at shorter distances. The membrane alignment when the magnets have fully attracted and are no longer separated should be a fraction of the width and length of the magnets (as the magnets will join face to face). Therefore, although smaller magnets may produce less force, they will align more precisely. A combination of large and small magnets (with possibly varying thicknesses as well) will optimize the system with the large magnets generating most of the attractive force, and the smaller magnets forcing very fine alignment. It is possible with electron-beam lithography to pattern nanomagnets as thin as 10 nm.

Nanomagnet alignment may be useful in processes that require thin membrane layers to be stacked or positioned on top of or relative to existing structures. This can be achieved in two ways:

The membrane to be added to the existing substrate can be fabricated separately. Nanomagnets of any of the discussed geometries are separately patterned onto the both the existing substrate and the separate membrane and magnetized separately with external fields. Using some kind of coarse positioning tool (for example, a mechanical stage and/or a flexture), the two sets of magnets are brought into close proximity and coarse alignment. From this point, the nanomagnets attract and automatically provide the fine alignment. Once attached to the substrate, the membrane is removed from the frame by etching.

Figures 3A, 3B:
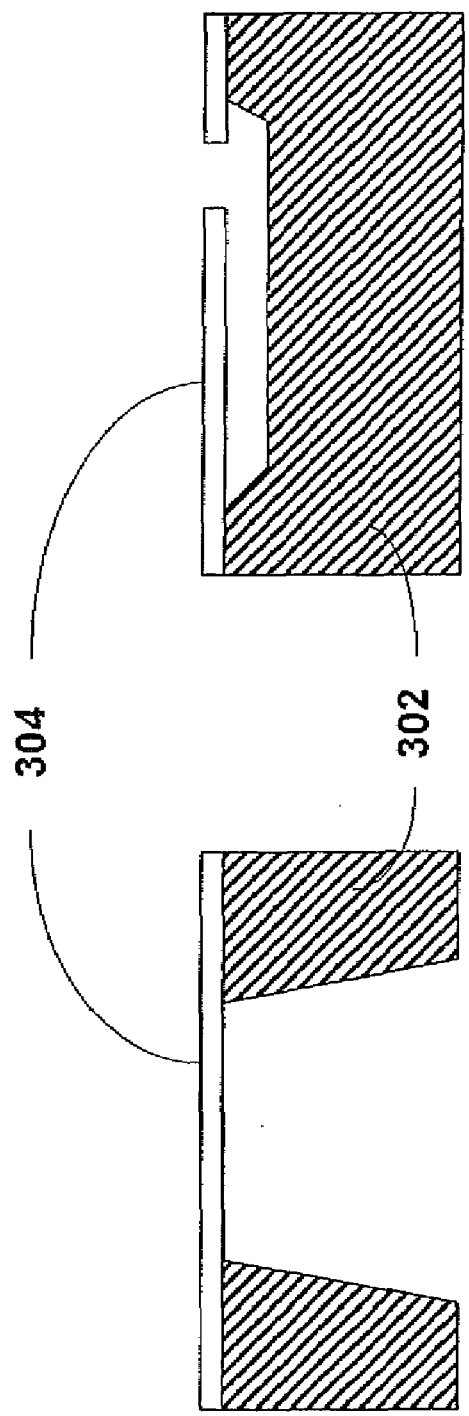
FIGS. 3a-b illustrate a back-side etch and an underside etch, respectively.

Two methods for producing 25 nm to 10 um thick membranes are back-side etching and under-etching of precisely deposited planar materials. The back-side etching holds the advantage that the membrane can then be patterned with nanomagnets and other functionality on both sides. FIGS. 3a-b illustrate a back-side etch and under-etch for stacking membranes and folding membranes, respectively. In FIGS. 3a-b, elements 302 and 304 represent the wafer (or substrate) and structural layer, respectively.

Figure 4:
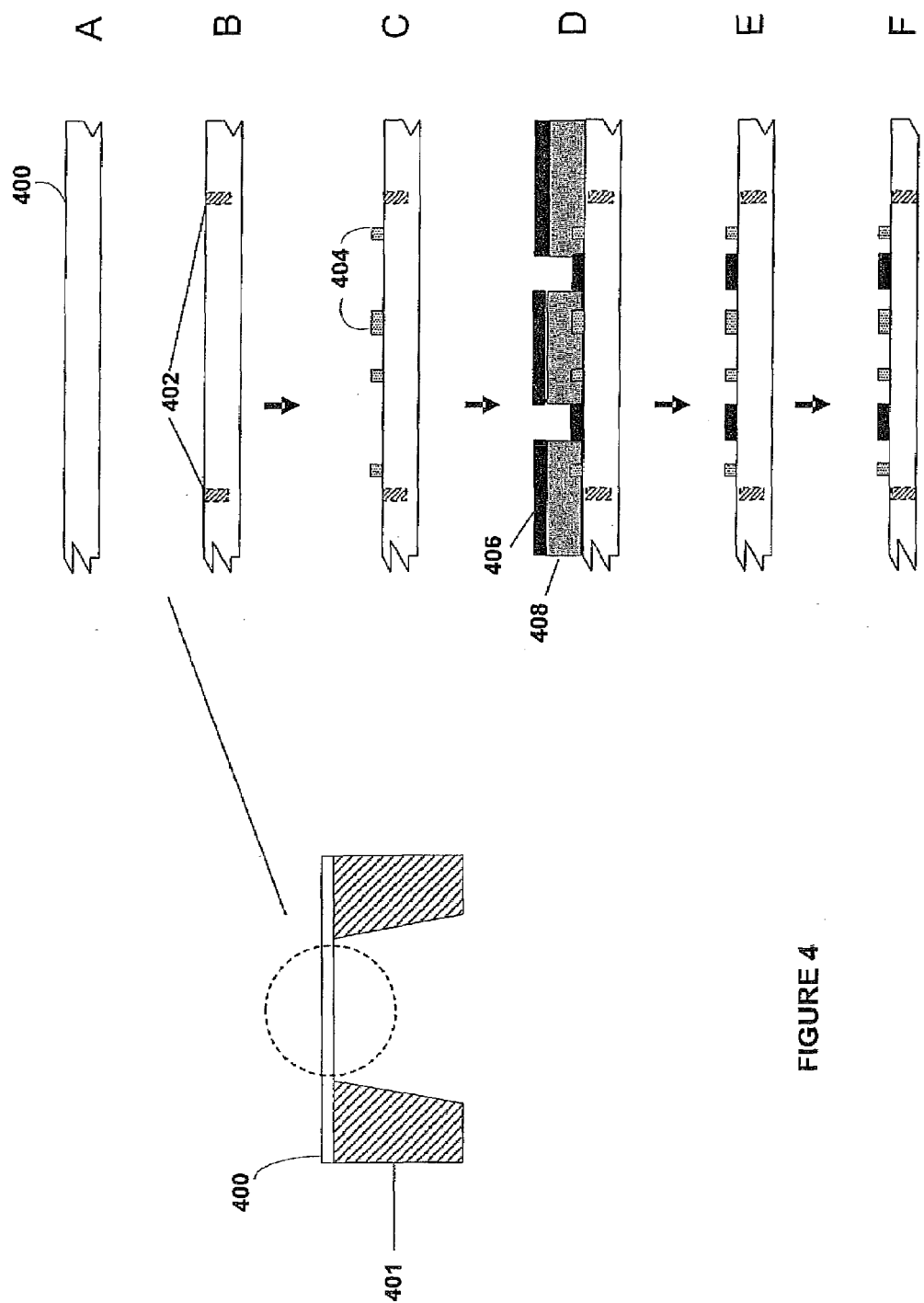
FIG. 4 illustrates a sample process flow associated with one embodiment of the present invention.

FIG. 4 illustrates a sample process flow. A thin membrane (e.g., silicon nitride) 300, formed on a substrate 401, is shown in step A. In step B of FIG. 4, flexural components, folding segments, and/or hinges are defined via etching on the thin membrane. Element 402 represents etched membrane portions. In step C, the functional device is patterned on the membrane. Element 404 represents device functional layers, etc.

Next, in step D, a layer of photo-resist (for lift-off) 408 and e-beam evaporated Co 406 is formed.

In step E (lift-off resist), nanomagnets are defined and, in step F, a backside etch is performed to release flexure or folding structure.

Figure 5:
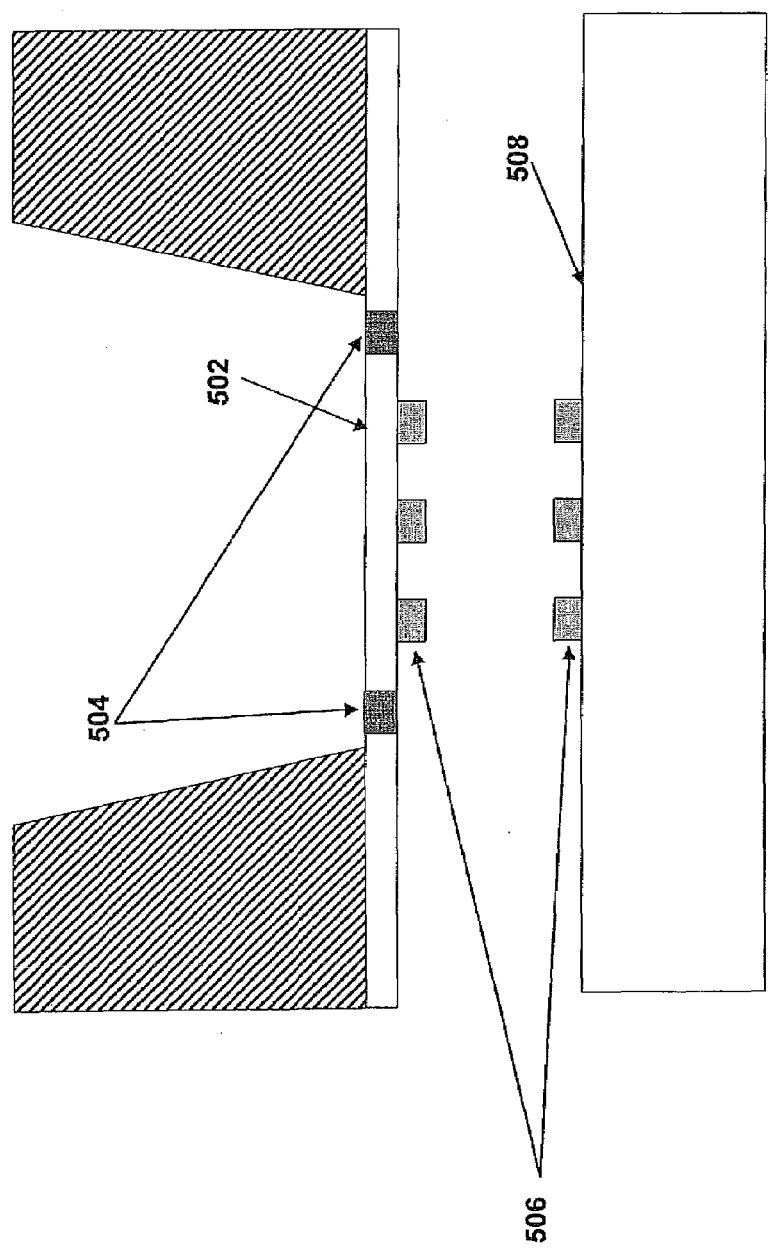
FIG. 5 illustrates an alignment mechanism between a membrane and a surface.

FIG. 5 illustrates an alignment mechanism between a membrane 502 and a surface 508. The membrane has a plurality of flexural components 504 and nanomagnets 506. The surface has a plurality of patterned nanomagnets 506. According to this embodiment, the alignment mechanism comprises: (a) applying an external, magnetic field to said nanomagnets on membrane 502, wherein the membrane is held by a positioning mechanism and the nanomagnets 506 are magnetized by the applied magnetic field; and (b) bringing membrane 502 into close proximity and coarse alignment to the surface 508 such that the nanomagnets on the membrane 502 attract to and self-align with the nanomagnets on the surface 508 based on the magnetizations. The membrane 502 is connected to a larger base by a mechanism compliant enough to allow the membrane to move when acted upon by nanomagnet forces. For example, the compliant mechanism may be any flexible thin film material or one or more flexures made out of a thin film. In one example, the compliant mechanism may be a membrane holding device that holds the membrane loosely enough that the membrane can still move around. In another example, compliant mechanism may be a property of the membrane holder or the substrate holder. In yet another example, compliant mechanism may be part of the connection mechanism, hinge, or between the membrane and surface.

A single membrane on a substrate may be folded onto itself to form a two-layered stack. The folding may be done by any means, but in an exemplary embodiment implemented with the Nanostructured Origami™ process (see the paper to Arora et al. titled "Membrane folding to achieve 3-D nanostructures: nano-patterned silicon nitride folded with stressed chromium hinges"). Prior to the folding, nanomagnets should be patterned onto the two portions of the membrane that are to be folded together. The nanomagnets should be oriented such that their length is perpendicular to the fold line. This patterning can be a single lithography step since both parts of the membrane lie adjacent on a single substrate. Then, both sets of nanomagnets can be simultaneously magnetized through their length with a single external magnetic field. When one portion of the membrane is folded 180° onto the other part, its nanomagnets' polarizations become opposite to those of the other part and the two sets of nanomagnets attract.

In addition, it is possible to use the cross shape nanomagnets (see FIG. 1b) with this folding method. The cross shapes should be oriented such that both bars are 45 degrees rotated with respect to the fold line. The applied magnetic field should be perpendicular to the fold line.

The nanomagnets should be positioned towards the outer edge of the membranes rather than the center to achieve the best alignment. (Any angular misalignment at the edge is much less at the center, although translational misalignment at the edge is the same at the center). This also allows the center of the membrane to be used completely for other functionality. Each nanomagnet pair creates two points of strong attraction at their poles. Increasing the number of pairs of nanomagnets creates more such alignment points. These alignment points should be spaced around the outer edge of the membrane to minimize overall alignment error. Depending on the geometry of the membrane they should be evenly spaced or concentrated at various points. Using more nanomagnets is almost always desirable because this increases the total alignment force and averages the overall error in nanomagnet fabrication variation/error. Many points of contact make the alignment more reliable and increase the latching force as well.

When used in conjunction with a self-assembling membrane folding method, there can be a completely self-assembled 3D device with nanometer-scaled alignment precision. This not only decreases costs of assembly for some devices, but also enables devices that were previously unattainable because of the prior need to interact with the macroscale world during fabrication. There is the potential that the nanomagnets can provide some form of template for more complex folded structures forcing the system to find some ideal minimum energy configuration.

An external magnetic field can be used to manipulate the membrane and assist in the assembly process of forming a 3D structure through membrane folding. The nanomagnets will prefer to have the direction of their magnetization parallel to the direction of a large applied external magnetic field. However, the geometry of the nanomagnets only allows their magnetization to be in the direction of their longest dimension. Therefore, a force is generated on the nanomagnets that moves them to be parallel to the applied field. If the nanomagnets are on a flexible cantilever or membrane, this will occur. The external field can be rotated and the nanomagnets will follow the rotation.

This could enable an active alignment mechanism using the external field. The active alignment system could be used in parallel with the passive alignment mechanism of the nanomagnets.

Nanomagnets have the additional advantage of being easily integrated into the CMOS platform. They require only one lithography step and one metal deposition step. This would not affect CMOS transistors, nor most other device platforms. Once the nanomagnets are ready, an additional device layer (membrane) can be deposited and automatically aligned by the nanomagnets.

The nanomagnets may also serve as a latching or locking mechanism. There continues to be a force between the magnets even after they are in contact. If desired, the top surface of the nanomagnets may bond or hold in stiction to create additional latching force. For example, many nanomagnets are covered with gold to prevent oxidation, and smooth gold surfaces bond together very easily. Using a larger number of pairs of nanomagnets will also increase the latching force between two membranes. The gap or spacing between two such latched membranes is determined by the total thickness of a pair of attracted nanomagnets. The sum thickness of a pair of nanomagnets may range from 10 nm to 1000 nm. This property may be used to accurately control the gap between two aligned and latched membranes.

The membranes must be thin enough to not have significant mass such that the alignment force generated by nanomagnets in proximity is enough to adjust the position of slightly misaligned membranes. However, there is no restriction on the length and width of the membranes. Each of these dimensions may be as large as the substrate the membranes are fabricated on (for example, conventional silicon wafers are 12 inches diameter) or as small as a cluster of nanomagnets (approximately 10 microns).

Two membranes may be aligned and latched together if they have identically arranged but oppositely magnetized sets of nanomagnets on their upper surfaces. Additional membranes may be added in two ways. First, a third membrane with nanomagnets may be placed directly on top of the back of the second membrane in the stack. Its nanomagnets are separated from those below it by the thickness of the second membrane in the stack. However, if this membrane is very thin (approximately less than 100 nm) there may still be enough alignment and attraction force between the magnets to position and fix the third layer. This may be repeated with a fourth, fifth, and n'th layer. The second method involves patterning nanomagnets on the frontside and backside of the membrane. This ensures that the nanomagnets of the additional (third, fourth, etc.) layers will directly contact nanomagnets on the backside of the layer below.

Patterning nanomagnets on the frontside and backside of a membrane may be done by spinning photoresist onto the frontside and the backside of the membrane, and performing lithography from either the frontside or backside that will expose both the frontside and the backside of the membrane simultaneously because the membrane is transparent to the high energy radiation used in lithography (i.e. UV light, x-rays, electrons). Any standard lithography including contact mask printing, projection lithography, and electron-beam lithography may be used. Both sides of the membrane can be developed simultaneously; nanomagnets can be vacuum deposited on both sides of the membrane in two separate deposition steps; finally the desired pattern of nanomagnets can be left behind with a single liftoff that works on both sides of the membrane simultaneously. The single exposure ensures that the nanomagnets on the front and back side of the membrane are of exactly the same shape and arrangement. Additionally, two separate membranes may be both covered with photoresist, brought into contact, and then exposed simultaneously.

In addition to aligning and latching stacks of membranes, nanomagnets may be used to align and latch other 3-D configurations of membranes. Membranes that are flexible, or have folds in them (such as those fabricated in the Nanostructured Origami™ technique (see the paper to Arora et al. titled "Membrane folding to achieve 3-D nanostructures: nano-patterned silicon nitride folded with stressed chromium hinges")) can have nanomagnets arranged primarily around their edges to precisely align and latch a final folded 3-D shape. The nanomagnets can also serve as actuating elements to deform this folded 3-D shape if a strong external magnetic field is applied.

The present invention is generally useful in the fabrication of 3-D structures out of thin membranes, typically on a semiconductor substrate. This includes, but is not limited to, 3-D integrated circuits involving out-of-plane transistor networks, 3-D optical structures including 3-D photonic crystals, volume holograms, 3-D memory chips, MEMS, field emitters, MEMS switches, bio- or chemical-MEMS, and hybrid combinations of the above and others. 3-D interconnections between two surfaces are possible only with precise alignment which is offered by the nanomagnets. Integrated circuits and computer memory may be stacked to increase chip density and reduce total interconnect length between transistors for faster processing. Core components of the processor may be placed closer together. The nanomagnets themselves may serve as an electrical connection between two layers. Optical structures such as photonic crystals require layer-to-layer alignment on the order of $1/20$ wavelength of the light incident on the structure (<50 nm). Pre-patterned membranes may be easily and accurately added to or built into various MEMS devices using the nanomagnets as well.

The present invention holds numerous advantages over other thin membrane alignment methods. A non-exhaustive list of advantages are described below.

The first advantage is that nanomagnets can be patterned with high positioning accuracy (~1 nm) with tools such as spatial phase-locked e-beam lithography (SPLEBL) (see the paper to Hastings et al. titled "Nanometer-level stitching in raster-scanning electron-beam lithography using spatial-phase locking"). The layer-to-layer membrane alignment should be comparable despite other errors in the definition of the nanomagnets such as shape and size errors from imperfect lithography.

A second advantage to this method is that the nanomagnets create an alignment force even when the membranes are not in contact. This is an improvement over strictly mechanical coupling scheme such as patterned pyramids and cavities or hydrophilic/hydrophobic coupling. Mechanical alignment schemes experience stiction at that scale, which makes high precision alignment difficult. Also, using nanomagnets for alignment does not require an external force to push the membranes together.

A third advantage of this method is the minimal extra material that is necessary. Mechanical alignment requires large mating shapes, and the size dictates the robustness of the alignment scheme. Therefore, additional difficult fabrication is necessary, and a substantial amount of extra material must be used to achieve alignment. The extra material may interfere with the device functionality. For example, the additional material may cause thermal problems in 3D integrated circuits.

A fourth advantage of this method is the simplicity of the nanomagnet patterning process. The nanomagnets can be patterned as an end-process, and the process is conducive to most semi-conductor materials and devices. Standard lithography tools can be used, and a thin ferromagnetic film can be easily deposited using sputtering, evaporation, electroplating or chemical vapor deposition.

A fifth advantage of this method is that the nanomagnets also serve as a locking mechanism for the device without consuming energy throughout the lifetime of the device. Other alignment schemes need an additional active or passive latching mechanism.

A sixth advantage of this method is that the nanomagnets can hold some device functionality after fabrication. For example, an external field can be applied to change the directionality of the magnetizations to disassemble the device.

A seventh advantage of this method is that an external magnetic field can be used to manipulate the membrane and assist in the assembly process of the 3D layered structure. This could enable an active alignment mechanism using the external field. The active alignment system could be used in parallel with the passive alignment mechanism of the nanomagnets. Also, an external field can be used to actuate the folding of 2D nanopatterned structures into 3D for the Nanostructured Origami™ 3D Fabrication and Assembly Process. This is especially advantageous for the Nanostructured Origami™ scheme because the hinges help to align the devices within the range of the nanomagnets and the nanomagnets can then align the structure.

An eighth advantage to this method is that the nanomagnets can provide the energy and template for self-assembly of complex structures. This, again, works with the Nanostructured Origami™ 3D Fabrication and Assembly Process for creating arbitrary 3D nanopatterned structures.

The nanomagnet alignment method may have commercial applications in 3D nanostructured devices such as 3D photonic crystals, 3D integrated circuits, 3D memory, 3D biological chips and systems, optical micro-devices, and other 3D hybrid nanostructured systems.

Also, although various examples of membrane alignment are described in the specification, it should be noted that the teachings of the present invention can also be used to align: (1) a membrane with another surface, (2) a membrane with another portion of the same membrane, or (3) a membrane with the substrate on which it was created. Variations such as above are covered within the scope of the present invention and should not be used to limit the scope of the present invention.

Although various examples are described wherein a flexural component such as a hinge is shown as being connected to a first and second membrane, other compliant mechanisms (allowing the membrane to move when acted on by nanomagnet forces) can be used without departing from the scope of the present invention. For example, the membrane and a surface or another membrane may be connected via a hinge, which permits the membranes to be folded together. The hinge may be a torsional bar, an elastic material, part of the membrane, an etched out portion of the membrane, or a thinned portion of the membrane. Further, the hinge may be actuated by material stress by applied voltage or current, by heating or cooling, by chemical reaction, or by moving a fluid or gas. The hinge may not be actuated but membrane or surface may be actuated and folded by an applied external magnetic field that is rotated (in this case, the nanomagnets are also used to fold over the membrane), by an external manipulator, by applied voltage, by material stress, heating or cooling, by chemical reaction, or by moving a fluid or gas.

Also, the compliant mechanism allowing the membrane to move when acted on by nanomagnet forces can be implemented using numerous techniques. For example, the compliant mechanism may be any flexible thin film material or one or more flexures made out of a thin film. The flexures are patterned and etched directly in membrane, or made by depositing, patterning, and etching additional material. Further, flexures may be connected to membrane before or after fabrication of membrane.

In one example, the compliant mechanism may be a membrane holding device that holds the membrane loosely enough that the membrane can still move around. In another example, compliant mechanism may be a property of the membrane holder or the substrate holder. In yet another example, compliant mechanism may be part of the connection mechanism, hinge, or between the membrane and surface Further, the membrane may or may not be subsequently detached from a holding device after alignment takes place. However, detachment may occur by etching, selective etching, breaking, releasing, or cutting, so that the membrane is no longer connected to the holder. In another example, the membrane may just be dropped from a holding device.

Although the specification describes the process for obtaining an aligned structure, it should be noted that a series representation and a parallel representation are within the scope of the present invention. For example, in a series construct, one of the above processes is repeated one or more times, with each set of nanomagnets on a membrane aligning to a previous set or another set on part or whole of a previously aligned membrane. In another example, for a parallel construct, more than one membrane may first be stacked in coarse alignment and then a field applied to align them all at the same time as described above.

CONCLUSION

A system and method has been shown in the above embodiments for the effective implementation of a thin membrane alignment method using patterned nanomagnets. While various preferred embodiments have been shown and described, it will be understood that there is no intent to limit the invention by such disclosure, but rather, it is intended to cover all modifications and alternate constructions falling within the spirit and scope of the invention, as defined in the appended claims. For example, the present invention should not be limited by material that can be aligned (e.g., membrane onto membrane alignment, membrane onto surface alignment, membrane onto substrate, etc.), type of flexural component, size, scale, materials (e.g., the material used to make the nanomagnet), or specific manufacturing techniques.

The invention claimed is:

1. A passive nanomagnet alignment method to self-align a membrane to a surface, said membrane and surface each having a plurality of nanomagnets patterned on it, said membrane connected to said surface by a hinge, said method comprising the steps of: (a) applying an external magnetic field to said nanomagnets on said membrane and said surface, said nanomagnets magnetized based on an applied external magnetic field; and (b) applying an actuation force to fold said membrane at said hinge, bringing said membrane into close proximity to said surface, said nanomagnets on said membrane self-aligning with nanomagnets on said surface based on nanomagnet magnetizations.

2. A passive nanomagnet alignment method to self-align a membrane to another surface, as per claim 1, wherein said surface is any of the following: another portion of the same membrane, another membrane or a substrate on which said membrane was fabricated.

3. A passive nanomagnet alignment method to self-align a membrane to another surface, as per claim 1, wherein said external field is applied to magnetize said nanomagnets and then removed prior to said folding leaving the nanomagnets at magnetic remanance.

4. A passive nanomagnet alignment method to self-align a membrane to another surface, as per claim 1, wherein said nanomagnets are magnetized by an external field at the same time as the membranes are brought together by folding allowing said self-alignment to take place while said nanomagnets are near magnetic saturation.

5. A passive nanomagnet alignment method to self-align a membrane to another surface, as per claim 1, wherein each of said nanomagnets are lithographically patterned and deposited by any of the following methods: evaporation, sputtering, electroplating, or chemical vapor deposition.

6. A passive nanomagnet alignment method to self-align a membrane to another surface, as per claim 1, wherein said nanomagnets are deposited on either one or both sides of said membrane.

7. A passive nanomagnet alignment method to self-align a membrane to another surface, as per claim 1, wherein said nanomagnets are patterned in a thin film made from a metal alloy that primarily comprises cobalt, iron, or nickel.

8. A passive nanomagnet alignment method to self-align a membrane to another surface, as per claim 1, wherein said nanomagnets are lithographically patterned into any of the following shapes: rectangular shapes, cross shapes, polygonal shapes, curved shapes, or out-of-plane pillars.

9. A passive nanomagnet alignment method to self-align a membrane to another surface, as per claim 1, wherein said nanomagnets have a thickness between 5 nm and 1 micron and lateral dimensions ranging from 10 nm and 100.mu.m.

10. A passive nanomagnet alignment method to self-align a membrane to another surface, as per claim 1, wherein said nanomagnets are arranged in a periodic or non-periodic array that consists of one or more types of nanomagnets based on shape, size, or material.

11. A passive nanomagnet alignment method to self-align a membrane to another surface, as per claim 1, wherein said membrane and said surface are patterned with devices or other functionality to be aligned with the nanomagnets.

12. A passive nanomagnet alignment method to self-align a membrane to another surface, as per claim 1, wherein said membrane and/or said hinge has sufficient structural compliance so that the attractive force between the nanomagnets can move said membrane into fine alignment.

13. A passive nanomagnet alignment method to self-align a membrane to another surface, as per claim 12, wherein said compliance is achieved via one or more flexural components patterned into said membrane or a hinge by lithography and material etching.

14. A passive nanomagnet alignment method to self-align a membrane to another surface, as per claim 12, wherein said compliance is achieved via one or more flexural components made by depositing and patterning additional material that connects the membrane to another membrane or a rigid substrate.

15. A passive nanomagnet alignment method to self-align a membrane to another surface, as per claim 1, wherein the nanomagnets latch together said membrane and said surface in a permanent or semi-permanent form.

16. A passive nanomagnet alignment method to self-align a membrane to another surface, said membrane and surface each having a plurality of nanomagnets patterned on it, said method comprising: (a) applying an external magnetic field to said nanomagnets on said membrane and said surface, said membrane held by a positioning mechanism and said nanomagnets magnetized based on said applied external magnetic field; and (b) bringing said membrane into close proximity and coarse alignment to said surface by said positioning mechanism, such that said nanomagnets on said membrane attract to and self-align with said nanomagnets on said surface based on the nanomagnet magnetizations.

17. A passive nanomagnet alignment method to self-align a membrane to another surface, as per claim 16, wherein said membrane is held by a flexural component connected to said positioning mechanism allowing said membrane to self-align with said nanomagnets on said surface when said positioning mechanism brings said membrane into said close proximity and said coarse alignment to said surface.

18. A passive nanomagnet alignment method to self-align a membrane to another surface, as per claim 16, wherein said surface is any of the following: another membrane, another substrate, or a portion of the same substrate that said former membrane was fabricated on.

19. A passive nanomagnet alignment method to self-align a membrane to another surface, as per claim 16, wherein said external field is applied to magnetize said nanomagnets and then removed prior to bringing said membrane in close proximity to said surface, leaving the nanomagnets at magnetic remanance.

20. A passive nanomagnet alignment method to self-align a membrane to another surface, as per claim 16, wherein said nanomagnets are magnetized by an external field at the same time as bringing said membrane to close proximity to said surface, allowing said self-alignment to take place while said nanomagnets are near magnetic saturation.

21. A passive nanomagnet alignment method to self-align a membrane to another surface, as per claim 16, wherein each of said nanomagnets are lithographically patterned and deposited by any of the following methods: evaporation, sputtering, electroplating, or chemical vapor deposition.

22. A passive nanomagnet alignment method to self-align a membrane to another surface, as per claim 16, wherein said nanomagnets are deposited on either one or both sides of said membrane.

23. A passive nanomagnet alignment method to self-align a membrane to another surface, as per claim 16, wherein said nanomagnets are patterned in a thin film made from a metal alloy that primarily comprises cobalt, iron, or nickel.

24. A passive nanomagnet alignment method to self-align a membrane to another surface, as per claim 16, wherein said nanomagnets are lithographically patterned into any of the following shapes: rectangular shapes, cross shapes, polygonal shapes, curved shapes, or out-of-plane pillars.

25. A passive nanomagnet alignment method to self-align a membrane to another surface, as per claim 16, wherein said nanomagnets have a thickness between 5 nm and 1 micron and lateral dimensions ranging from 10 nm and 100.mu.m.

26. A passive nanomagnet alignment method to self-align a membrane to another surface, as per claim 16, wherein said nanomagnets are arranged in a periodic or non-periodic array that consists of one or more types of nanomagnets based on shape, size, or material.

27. A passive nanomagnet alignment method to self-align a membrane to another surface, as per claim 16, wherein said membrane and said surface are patterned with devices or other functionality to be aligned with the nanomagnets.

28. A passive nanomagnet alignment method to self-align a membrane to another surface, as per claim 17, wherein said membrane and/or said flexural component has sufficient structural compliance so that the attractive force between the nanomagnets can move said membrane into fine alignment.

29. A passive nanomagnet alignment method to self-align a membrane to another surface, as per claim 28, wherein said compliance is achieved via one or more flexural components patterned into said membrane or a hinge by lithography and material etching.

30. A passive nanomagnet alignment method to self-align a membrane to another surface, as per claim 28, wherein said compliance is achieved via one or more flexural components made by depositing and patterning additional material that connects the membrane to another membrane or a rigid substrate.

31. A passive nanomagnet alignment method to self-align a membrane to another surface, as per claim 16, wherein the nanomagnets latch together said membrane and said surface in a permanent or semi-permanent form.

32. A passive nanomagnet alignment method to self-align a membrane to another surface, as per claim 16, wherein said nanomagnets serve as electrical connections between said aligned membrane and said surface.

33. A passive nanomagnet alignment method to self-align a membrane to another surface, as per claim 16, wherein said nanomagnets on said membrane and said surface differ in shape, size or material.

34. A passive nanomagnet alignment method to self-align a membrane to another surface, as per claim 16, wherein said passive alignment method is repeated a plurality of times to form a set of aligned structures.

35. A passive nanomagnet alignment method to self-align a membrane to another surface, as per claim 16, wherein said passive alignment method is used to align a plurality of membranes having nanomagnets simultaneously.

\* \* \* \* \*

UNITED STATES PATENT AND TRADEMARK OFFICE
CERTIFICATE OF CORRECTION

PATENT NO. : 7,644,489 B2  Page 1 of 1
APPLICATION NO. : 11/513952
DATED : January 12, 2010
INVENTOR(S) : Arora et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 630 days.

Signed and Sealed this

Sixteenth Day of November, 2010

David J. Kappos
*Director of the United States Patent and Trademark Office*